US011441329B2

(12) United States Patent
Tseng et al.

(10) Patent No.: US 11,441,329 B2
(45) Date of Patent: Sep. 13, 2022

(54) HANDLE LOCKING STRUCTURE

(71) Applicant: HANWIT PRECISION INDUSTRIES LTD., New Taipei (TW)

(72) Inventors: Ying-Chih Tseng, New Taipei (TW); Ching-Kai Chang, New Taipei (TW)

(73) Assignee: HANWIT PRECISION INDUSTRIES LTD., New Taipei (TW)

( * ) Notice: Subject to any disclaimer, the term of this patent is extended or adjusted under 35 U.S.C. 154(b) by 266 days.

(21) Appl. No.: 16/912,098

(22) Filed: Jun. 25, 2020

(65) Prior Publication Data

US 2021/0404212 A1 Dec. 30, 2021

(51) Int. Cl.
  *E05B 13/10* (2006.01)
  *E05B 63/22* (2006.01)
  (Continued)

(52) U.S. Cl.
  CPC .............. *E05B 13/10* (2013.01); *E05B 59/00* (2013.01); *E05B 63/22* (2013.01); *E05C 3/045* (2013.01);
  (Continued)

(58) Field of Classification Search
  CPC ......... Y10T 292/0849; Y10T 292/0911; Y10T 292/0949; Y10T 292/0951; Y10T 292/0952; Y10T 292/0953; Y10T 292/0954; Y10T 292/0956; Y10T 292/0959; Y10T 292/1039; Y10T 292/1041; Y10T 292/1043; Y10T 292/108; Y10T 292/1083; Y10T 292/1084; Y10T 292/1085; Y10T 292/1086; Y10T 292/1089; Y10T 292/1092; Y10T 292/57; Y10T 70/5097; Y10T 70/5128; Y10T 70/5133; Y10T 70/5124; Y10T 70/5761; Y10T 70/5765; Y10T 70/577; E05B 13/10; E05B 59/00; E05B 63/22; E05B 13/00; E05B 13/002; E05B 13/106; E05B 1/00;
  (Continued)

(56) References Cited

U.S. PATENT DOCUMENTS 3,313,586 A * 4/1967 McClintock ............. H01H 3/20
                                                                          312/332.1
5,208,735 A * 5/1993 Twachtmann ....... H05K 7/1411
                                                                          403/18
(Continued)

FOREIGN PATENT DOCUMENTS

EP           1776005 A2 *  4/2007  ............. G06F 1/186

*Primary Examiner* — Kristina R Fulton
*Assistant Examiner* — Steven A Tullia
(74) *Attorney, Agent, or Firm* — Muncy, Geissler, Olds & Lowe, P.C.

(57) ABSTRACT

A handle locking structure includes a handle having a pivot portion pivotally connected to a sliding box, a buckle portion for hooking on a cabinet and a handle shaft, and a positioning structure including a base connected to the handle shaft, a positioning device mounted in the base and an elastic member placed on the positioning device. When the handle is hooked on the cabinet, a peripheral limiter of a head member of the positioning device is disengaged from a position-limiting notch of the base to reset the elastic member, so that the positioning device is automatically locked to the sliding box, avoiding vibration of the handle and improving the locking stability of the handle.

12 Claims, 15 Drawing Sheets

(51) Int. Cl.
  *E05B 59/00* (2006.01)
  *E05C 3/16* (2006.01)
  *E05C 3/04* (2006.01)
  *H05K 7/14* (2006.01)

(52) U.S. Cl.
  CPC ............ *E05C 3/16* (2013.01); *E05Y 2900/20* (2013.01); *H05K 7/1488* (2013.01)

(58) Field of Classification Search
  CPC ........ E05B 1/003; E05B 7/00; E05B 15/0086; E05B 41/00; E05B 57/00; E05C 3/16; E05C 3/00; E05C 3/004; E05C 3/02; E05C 3/04; E05C 3/041; E05C 3/042; E05C 3/043; E05C 3/045; E05C 3/046; E05Y 2900/20; H05K 7/1488; H05K 7/1411; Y10S 292/30; Y10S 292/49
  USPC ...................................................... 312/332.1
  See application file for complete search history.

(56) References Cited

U.S. PATENT DOCUMENTS

| | | | | |
|---|---|---|---|---|
| 6,494,729 B1* | 12/2002 | Stathopoulos | ....... | H01R 13/701 439/372 |
| 7,125,272 B1* | 10/2006 | Liang | ................... | H05K 7/1489 361/732 |
| 7,749,006 B2* | 7/2010 | Chiang | ................ | H05K 7/1409 439/160 |
| 8,385,076 B2* | 2/2013 | Peng | .................... | G11B 33/124 361/740 |
| 8,585,161 B2* | 11/2013 | Gong | .................... | H05K 5/023 312/223.2 |
| 10,327,547 B1* | 6/2019 | Shih | ........................ | A47B 88/48 |
| 2004/0046398 A1* | 3/2004 | Haab | ....................... | E05C 17/50 292/96 |
| 2005/0111178 A1* | 5/2005 | Bradley | ................ | H05K 7/1411 360/99.06 |
| 2005/0282419 A1* | 12/2005 | Schlack | ............... | H01R 13/701 439/152 |
| 2007/0140787 A1* | 6/2007 | Champion | .............. | G06F 1/183 403/321 |
| 2009/0086456 A1* | 4/2009 | Milo | .................... | H05K 7/1409 361/801 |
| 2010/0294905 A1* | 11/2010 | Peng | ....................... | G06F 1/187 248/222.12 |
| 2013/0107424 A1* | 5/2013 | Thomas | ............... | H05K 7/1489 361/679.01 |
| 2015/0296649 A1* | 10/2015 | Wang | .................... | H05K 7/1409 403/326 |
| 2016/0066466 A1* | 3/2016 | Aldea | ........................ | F16B 2/10 361/759 |
| 2016/0120056 A1* | 4/2016 | Kuang | ..................... | G06F 1/186 403/322.4 |
| 2016/0219745 A1* | 7/2016 | Loparco | ................ | H05K 7/1492 |
| 2016/0360636 A1* | 12/2016 | Magnoux | .............. | H05K 7/1461 |
| 2017/0042054 A1* | 2/2017 | Su | ......................... | H05K 7/1409 |
| 2019/0075667 A1* | 3/2019 | Ehlen | ...................... | H05K 5/0239 |
| 2020/0061800 A1* | 2/2020 | Wu | ........................... | B25G 3/08 |
| 2020/0170136 A1* | 5/2020 | Huang | ...................... | B25B 27/14 |

* cited by examiner

HANDLE LOCKING STRUCTURE

BACKGROUND OF THE INVENTION

1. Field of the Invention

The present invention relates to fastening devices and, more particularly to a handle locking structure so configured that when the buckle portion of the handle is hooked on the cabinet, the peripheral limiter of the head member is disengaged from the position-limiting notch of the base to reset the elastic member, so that the fixing portion of the positioning device is automatically locked to the sliding box, avoiding vibration of the handle and improving the locking stability of the handle.

2. Description of the Related Art

With the vigorous development of electronic technology, computer technology is used to bring convenience, comfort, speed and other high-efficiency functions in life and work. Therefore, the application functions of electronic technology and computer systems are getting stronger and stronger, and the scope is getting wider and wider. In addition to the general personal use computers, central processing systems are widely used for centralized management and control operations. Such as: industrial computer room, central management and control system of the building, central management and control system of the operating system of the automated plant, central processing and control system of video and audio playback, etc., all through centralized management. In a central processing system, multiple computer mainframes, servers, operation conversion systems, etc. are individually accommodated in respective sliding boxes that are arranged in a stack inside a cabinet. These sliding boxes can be individually pulled out of the cabinet for carrying out assembly or maintenance operations of various computer operating systems. Because multiple operating host systems are combined in the cabinet, when various computer operating systems need to be inspected or updated, or other related operations need to be performed, the sliding boxes of different layers must be pulled out of the cabinet one by one to facilitate inspection or related maintenance operations. Therefore, many stacked sliding boxes assembled in the cabinet are provided with a simple buckling structure, so that the buckle structure can be used to facilitate the assembly of the sliding boxes in the cabinet, or the sliding boxes can be pulled out of the cabinet.

However, for the currently used buckle structure, please refer to FIGS. 14 and 15, the movable handle A of the conventional cabinet is locked to the inner screw hole B11 of the cylinder B1 of the object B by the fastening member A1 in order for the movable handle A to rotate and swing using the cylinder B1 on the object B so that the hook A2 on the movable handle A can be used to achieve the purpose of locking. When this type of handle A is actually assembled and applied, there are still many inconveniences and defects. For example: the movable handle A is moving to the positioning, and locking is formed through the hook A2. After positioning, the movable handle A cannot be accurately positioned. As long as the movable handle A is slightly affected by external forces, it is quite easy to loosen, causing the hook A2 to unbuckle and resulting in inconvenience in use.

Therefore, how to solve the problems and deficiencies of the above-mentioned prior art design is the direction that the relevant manufacturers in this industry are eager to study and improve.

SUMMARY OF THE INVENTION

The present invention has been accomplished under the circumstances in view. It is therefore the main object of the present invention to provide a handle locking structure, which comprises a handle and a positioning structure. The handle comprises a pivot portion pivotally connected to a sliding box, a buckle portion located at one side relative to the pivot portion for hooking on a cabinet, and a handle shaft located at an opposite side relative to the pivot portion. The positioning structure comprises a base connected to the handle shaft, a positioning device mounted in the base, and an elastic member placed on the positioning device. The base comprises a perforation, an accommodation chamber with a larger outer diameter recessed on one end of the perforation, and a position-limiting notch located on the peripheral wall of the accommodation chamber. The positioning device comprises a head member accommodated in the accommodation chamber and provided with a peripheral limiter for positioning in the position-limiting notch, a shank inserted through the perforation and connected with one end thereof to the head member, a stop block located at an opposite end of the shank for stopping against an upright lug of the cabinet, and a fixing portion extended from the stop block opposite to the shank for positioning on the upright lug of the cabinet. The elastic member comprises an elastically compressible coil body mounted around the shank, and two positioning means respectively located at two opposite ends of the elastically compressible coil body and respectively fastened to the base and the stop block. When the buckle portion of the handle is hooked on the cabinet, the peripheral limiter of the head member is disengaged from the position-limiting notch of the base, and the elastic member is elastically reset from the twisted state, causing the fixing portion of the positioning device to be locked to the sliding box. In this way, the handle locking structure is firmly combined with the sliding box, and there will be no shaking or vibration to avoid loosening due to collisions, thereby achieving the purpose of improving the locking stability of the handle.

It is another object of the present invention to provide a handle locking structure, which can be conveniently positioned on the sliding box simply by turning the handle to automatically achieve the locking effect, so that the operation process is intuitive and no additional locking is required, improving the smoothness of locking.

It is still another object of the present invention to provide a handle locking structure, which automatically compresses the elastic member when the positioning structure is positioned on the sliding block, wherein when unlocking the positioning structure, the peripheral limiter of the head member is aimed at the position-limiting notch of the base, at this time, the elastic member is elastically reset to push the base and the positioning device outward, so that the peripheral limiter of the head member is automatically engaged into the position-limiting notch of the base, thereby achieving the purpose of improving the convenience during operation.

Other and further benefits, advantages and features of the present invention will be understood by reference to the following specification in conjunction with the accompanying drawings, in which like reference characters denote like elements of structure.

DETAILED DESCRIPTION OF THE PREFERRED EMBODIMENT

Figure 1:
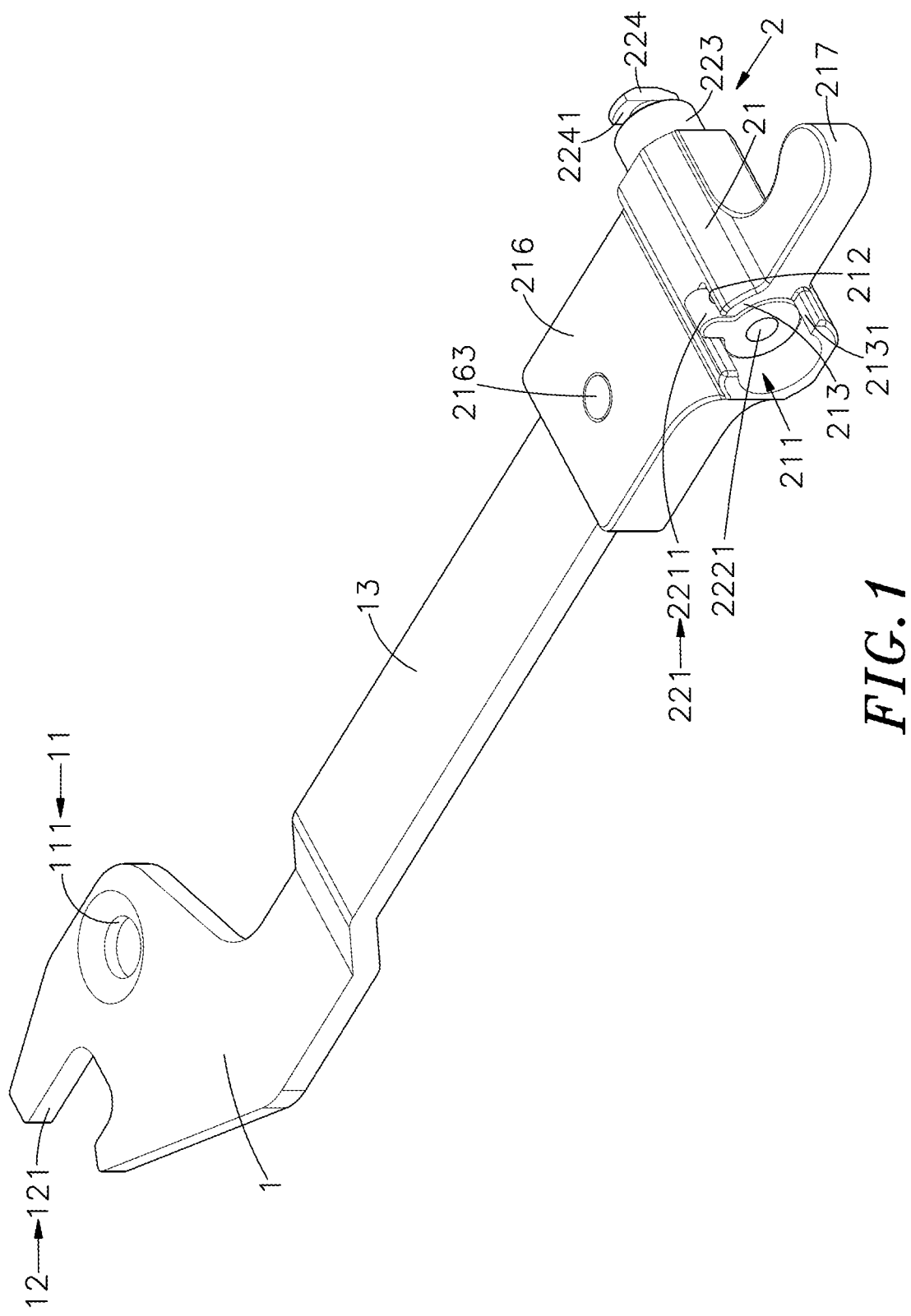
FIG. 1 is an oblique top elevational view of a handle locking structure in accordance with the present invention.
Figure 2:
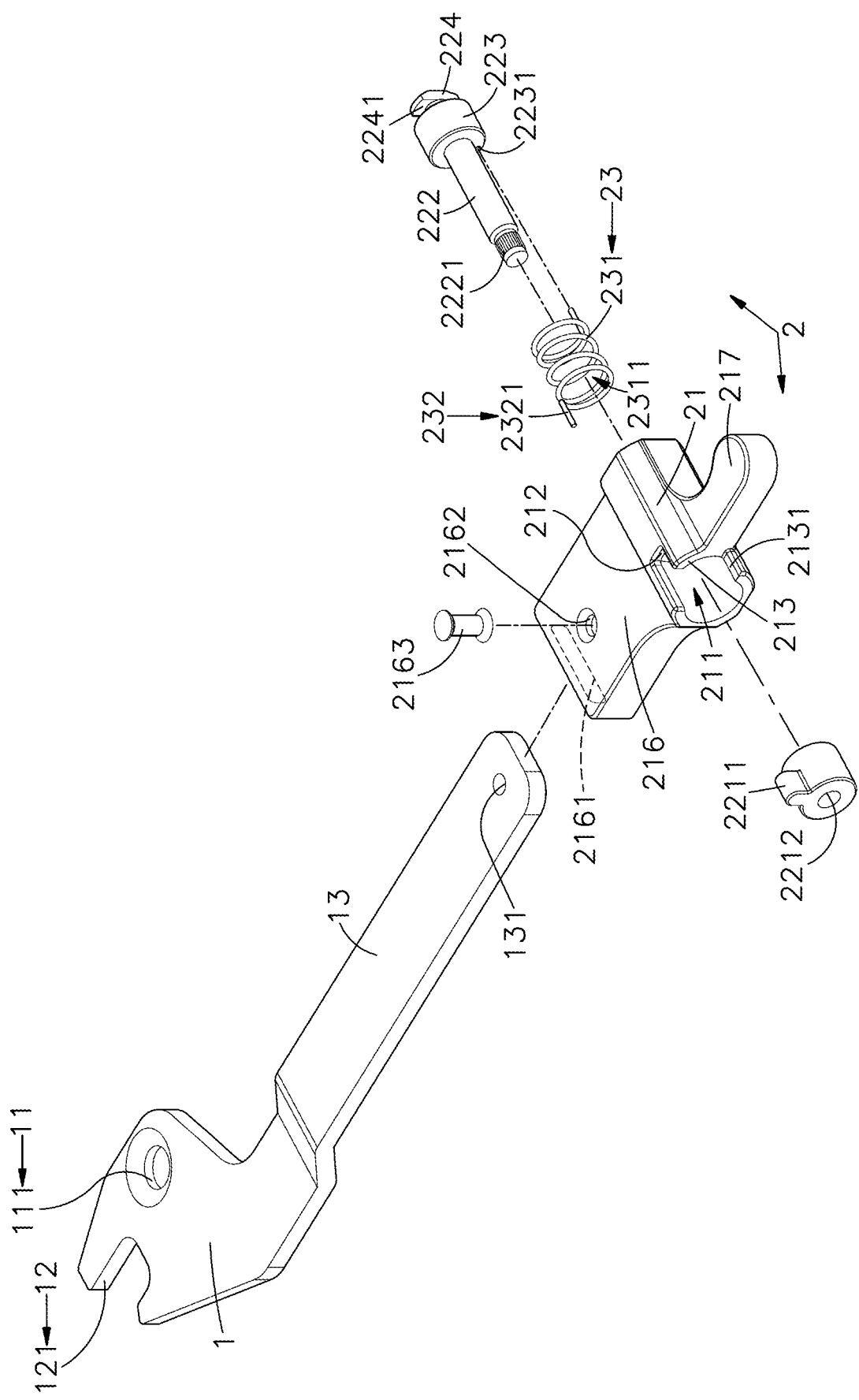
FIG. 2 is an exploded view of the handle locking structure in accordance with the present invention.
Figure 3:
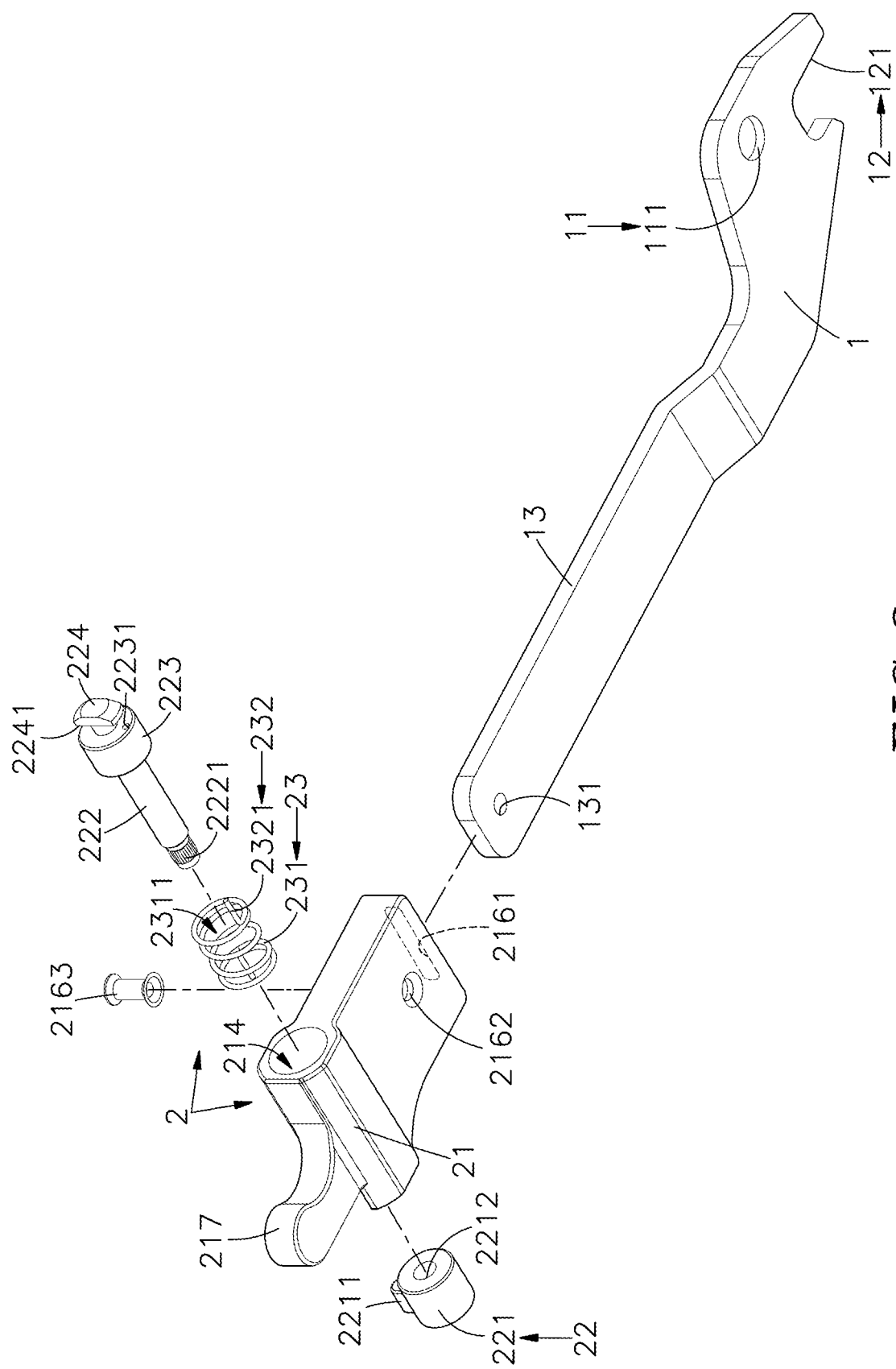
FIG. 3 corresponds to FIG. 2 when viewed from another angle.
Figure 4:
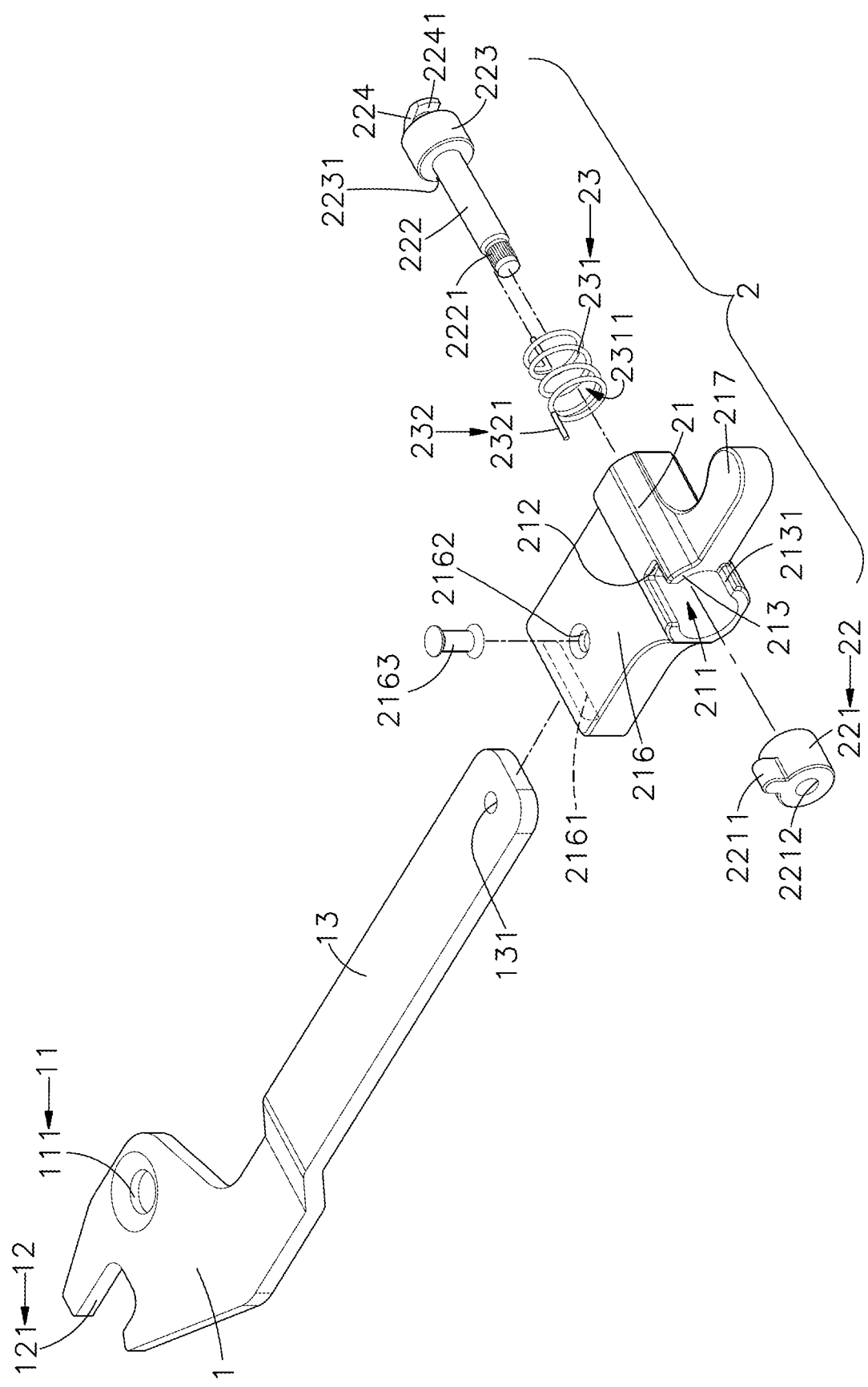
FIG. 4 is another exploded view of the handle locking structure in accordance with the present invention.
Figure 5:
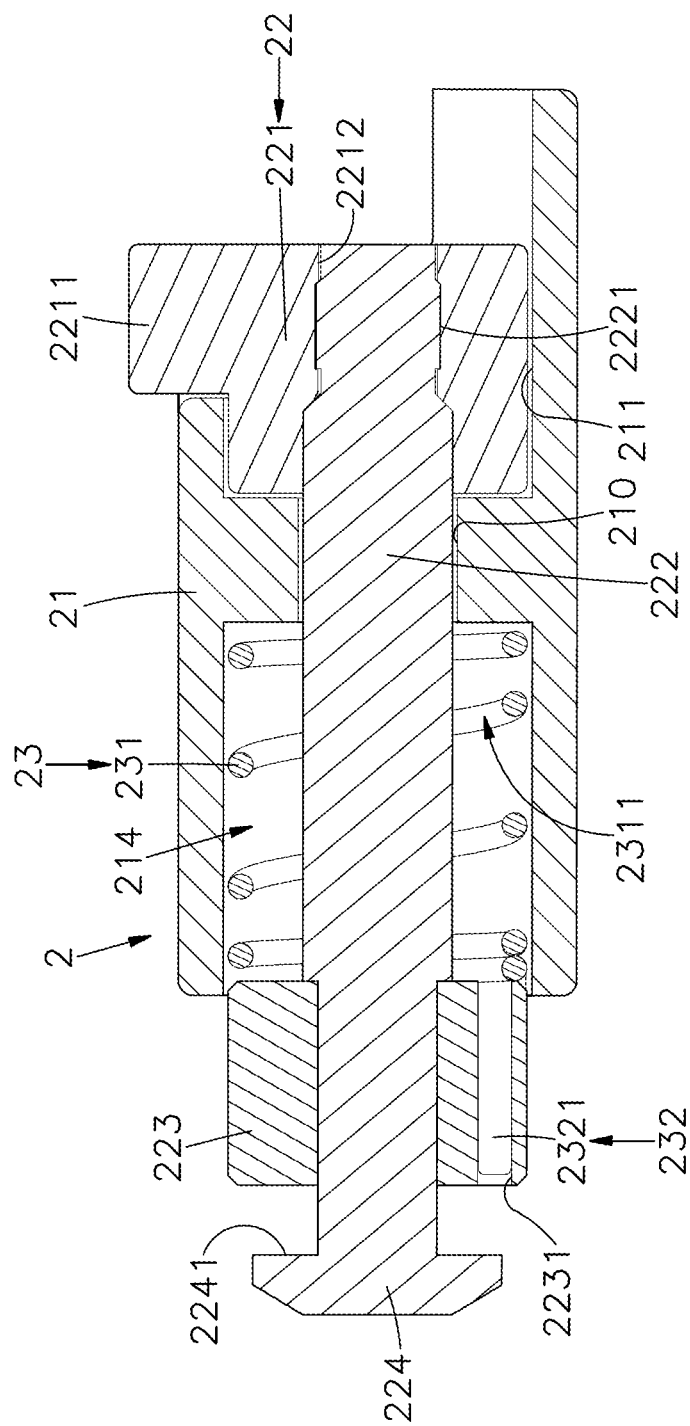
FIG. 5 is a sectional side view of the handle locking structure in accordance with the present invention.
Figure 6:
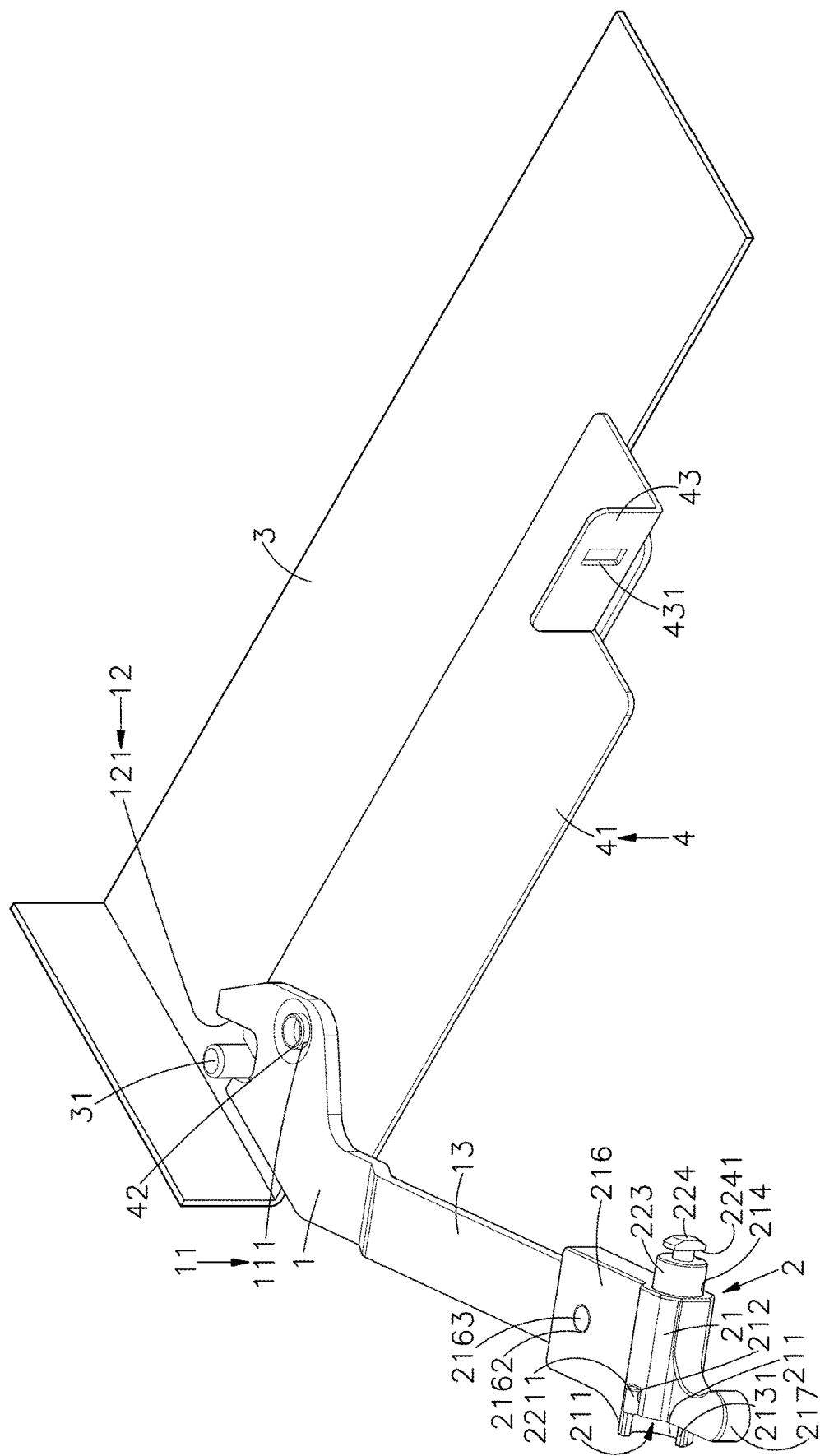
FIG. 6 is an applied view of the handle locking structure in accordance with the present invention (I).
Figure 7:
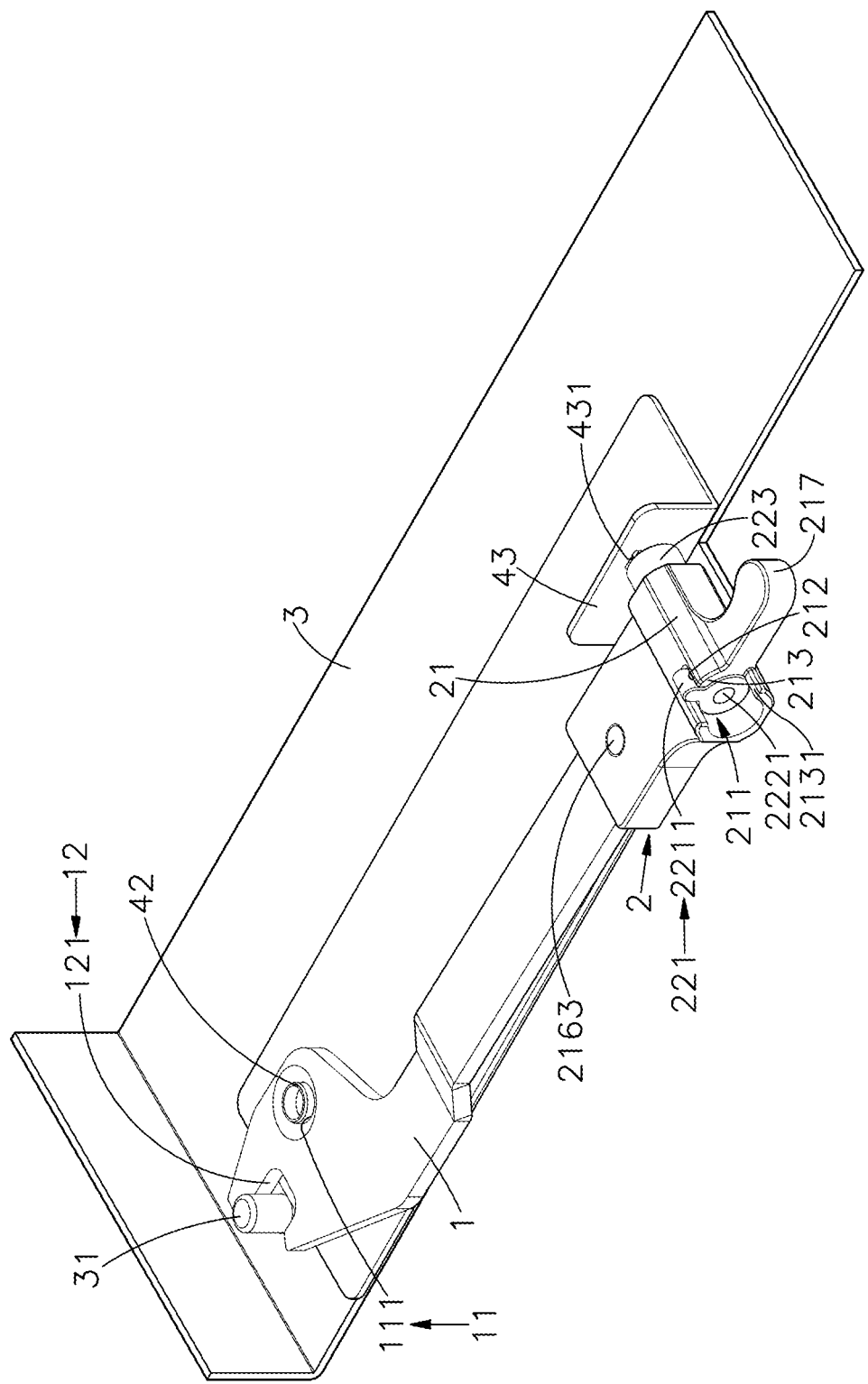
FIG. 7 is an applied view of the handle locking structure in accordance with the present invention (II).
Figure 8:
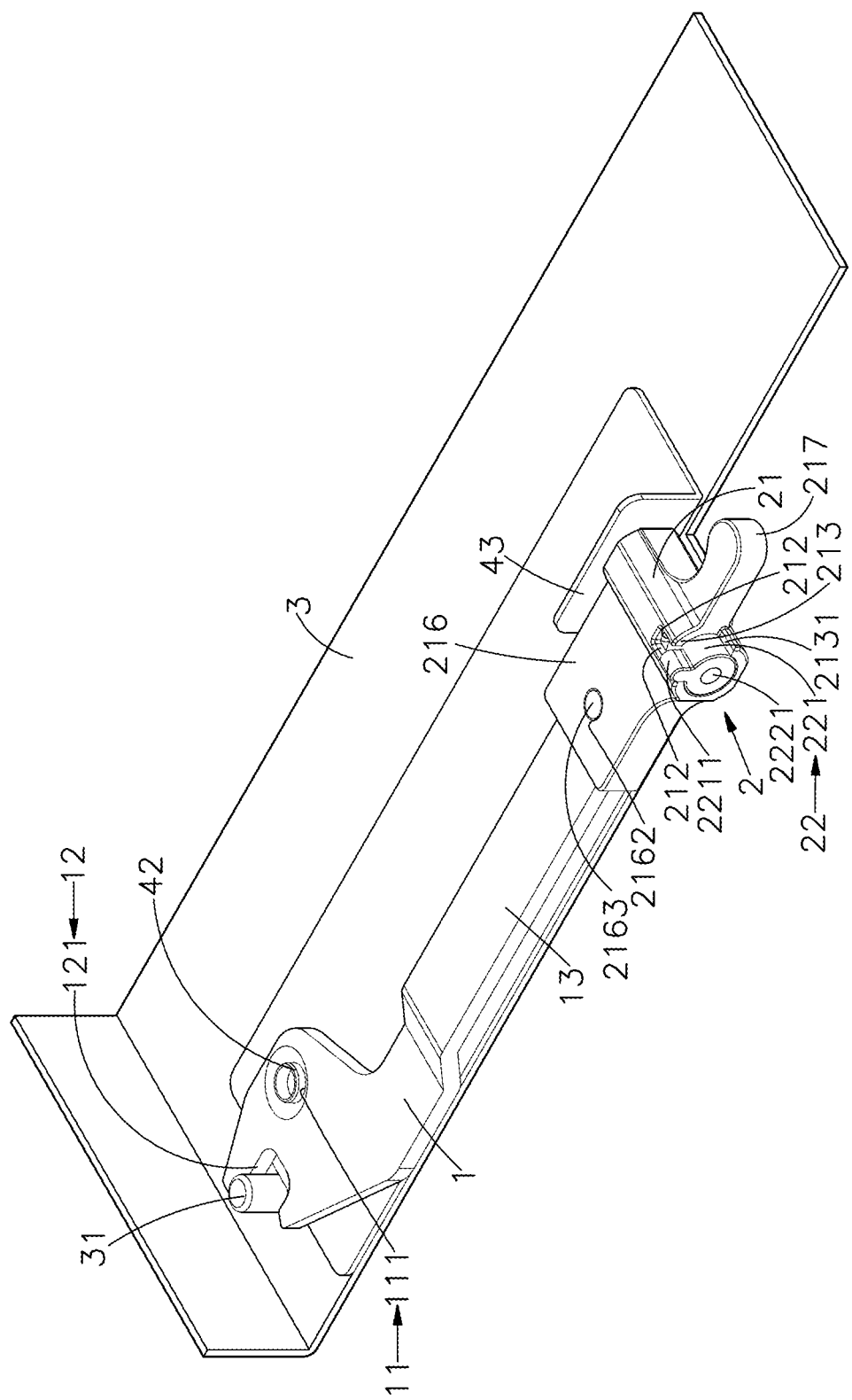
FIG. 8 is an applied view of the handle locking structure in accordance with the present invention (III).
Figure 9:
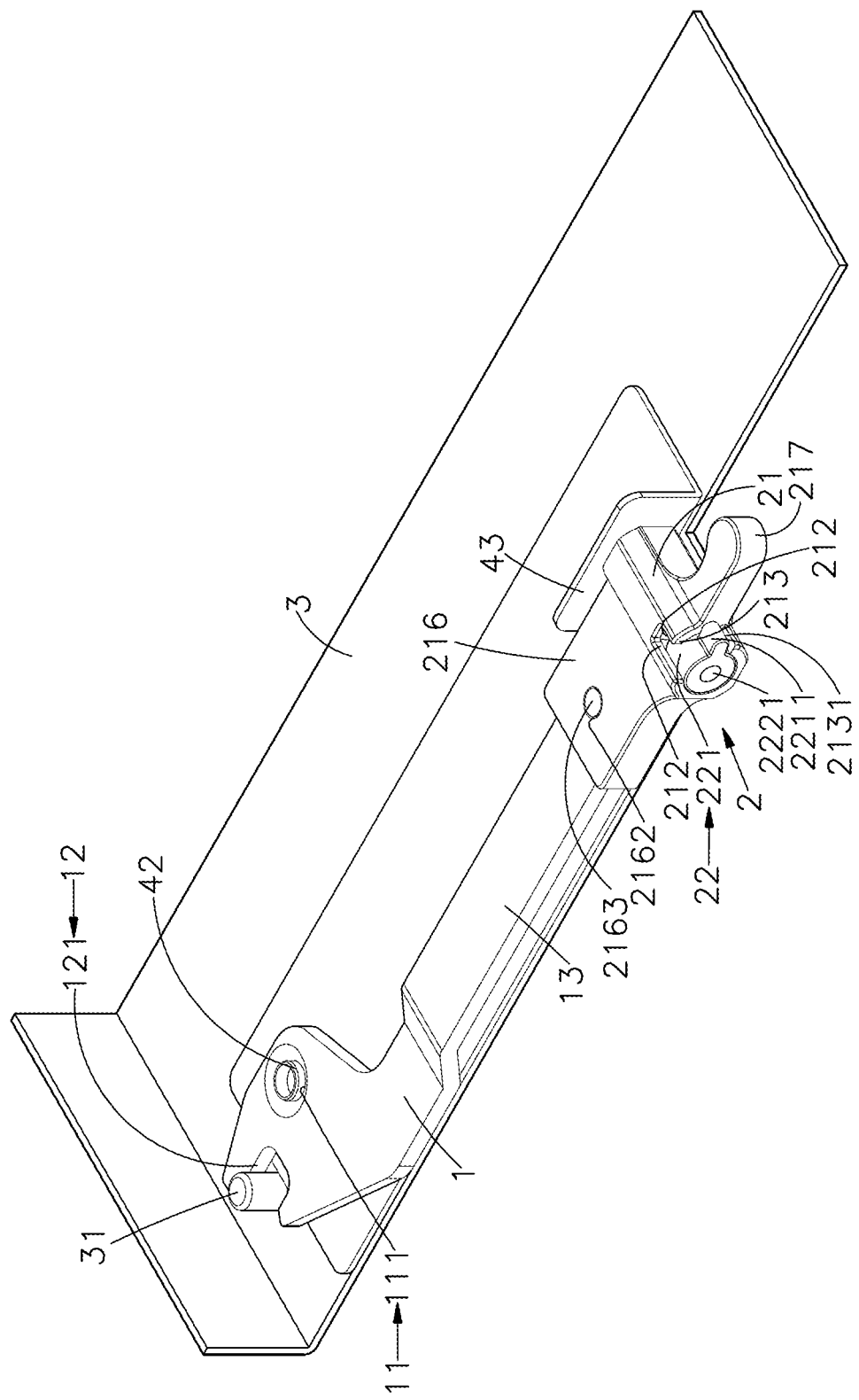
FIG. 9 is an applied view of the handle locking structure in accordance with the present invention (IV).
Figure 10:
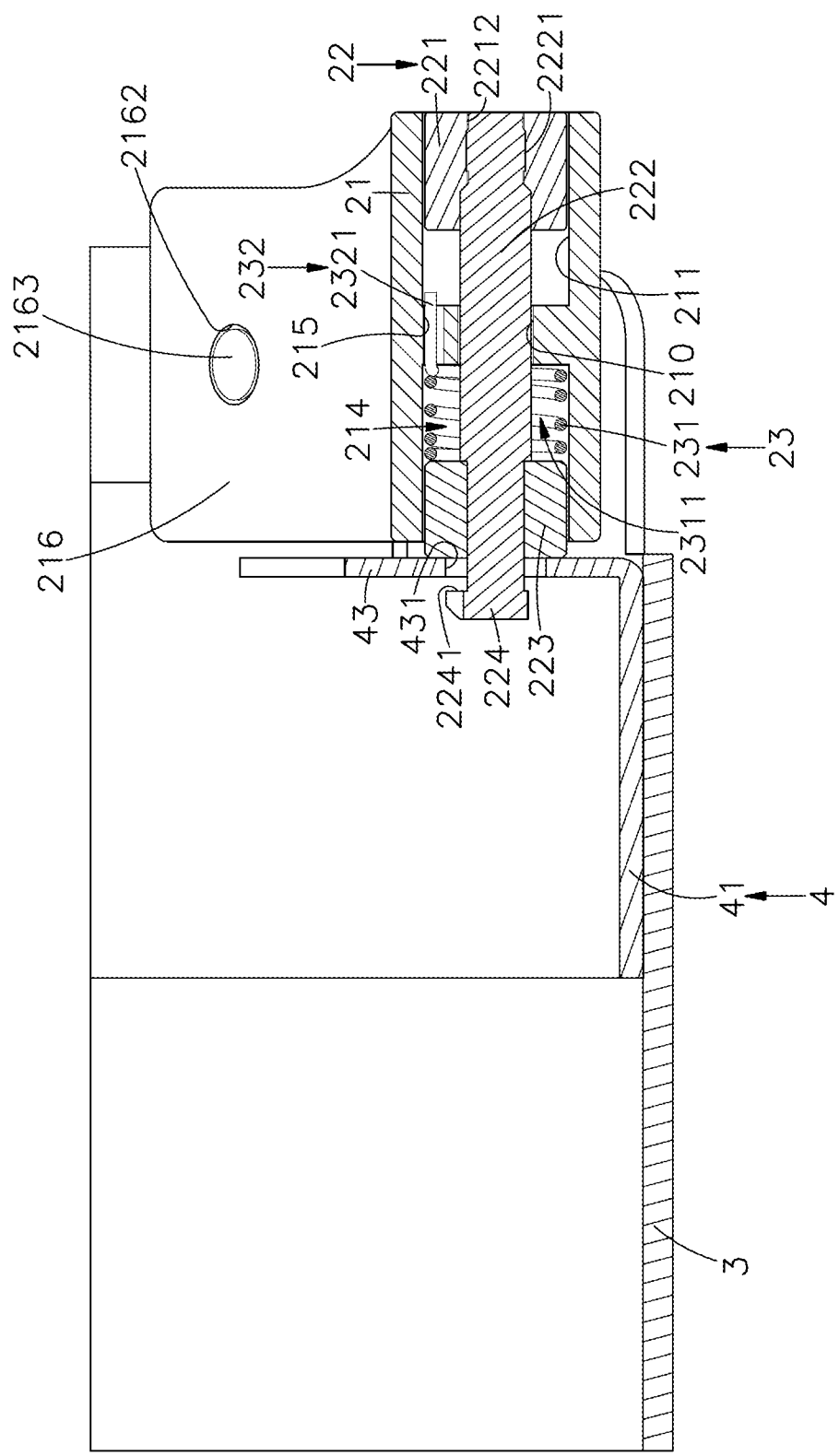
FIG. 10 is a sectional side view of the present invention after locking.

Referring to FIGS. 1-5, a handle locking structure in accordance with the present invention is shown. The handle locking structure comprises a handle 1 and a positioning structure 2.

The handle 1 comprises a pivot portion 11, a pivot hole 111 vertically cut through the pivot portion 11, a buckle portion 12 located at one side relative to the pivot portion 11, a buckle groove 121 formed on the buckle portion 12 remote from the pivot portion 11, a handle shaft 13 located at an opposite side relative to the pivot portion 11, and a mounting hole 131 formed on a distal end of the handle shaft 13 remote from the pivot portion 11.

The positioning structure 2 comprises a base 21, a positioning device 22 and an elastic member 23. The base 21 comprises a perforation 210, an accommodation chamber 211 with a larger outer diameter recessed on one end of the perforation 210, a receiving chamber 214 with a larger outer diameter recessed on an opposite end of the perforation 210, a position-limiting notch 212 located on the peripheral wall of the accommodation chamber 211, a sliding groove 213 located on the peripheral wall of the accommodation chamber 211 and radially extended from a part of one lateral side of the position-limiting notch 212, a stop edge 2131 located on the peripheral wall of the accommodation chamber 211 at one end of the sliding groove 213 remote from the position-limiting notch 212, a positioning hole 215 located on an inner bottom wall of the receiving chamber 214, a docking portion 216 located at one lateral side thereof, a finger rod 217 located at an opposite lateral side thereof, an insertion slot 2161 formed on an outer lateral side of the docking portion 216 for receiving the handle shaft 13, a mating-connection hole 2162 vertically cut through opposing top and bottom walls of the docking portion 216 across the insertion slot 2161, and a rivet 2163 fastened to the mounting hole 131 and the mating-connection hole 2162 to pivotally connect the handle shaft 13 of the handle 1 to the base 21.

The positioning device 22 of the positioning structure 2 comprises a cylindrical head member 221, which is received in the accommodation chamber 211 of the base 21 and provided with an axially extended riveting hole 2212 and a peripheral limiter 2211, a shank 222 having a riveting endpiece 2221 extended from one end thereof and rivetted to the riveting hole 2212, a stop block 223 with a larger diameter fixedly provided at an opposite end of the shank 222, a recessed hole 2231 located on a front side of the stop block 223 adjacent to the shank 222, and a fixing portion 224 with two opposite stoppers 2241 extended from an opposing rear side of the stop block 223. The elastic member 23 is made of an elastic material (such as metal wire, rubber, plastic, synthetic resin or elastic wire) and placed on the shank 222 of the positioning device 22, having an elastically compressible coil body 231 that surrounds a passage hole 2311 for the passing of the shank 222 and two positioning means 232 respectively located at two opposite ends of the elastically compressible coil body 231 and respectively fastened to the base 21 and the stop block 223. The two positioning means 232 are positioning tips 2321 respectively extended from the two opposite ends of the elastically compressible coil body 231 and respectively fastened to the positioning hole 215 and the recessed hole 2231.

When the handle locking structure of the present invention is actually assembled, attach the elastic member 23 of the positioning structure 2 onto the shank 222 of the positioning device 22 and fasten the positioning tip 2321 of the positioning means 232 at one end of the elastic member 23 to the recessed hole 2231 on the stop block 223, then insert the positioning device 22 into the perforation 210 of the base 21 and fasten the positioning tip 2321 of the positioning means 232 at the other end of the elastic member 23 to the positioning hole 215 of the base 21, and then rotate the elastic member 23 (clockwise or counter-clockwise) through a predetermined angle to elastically deform the elastically compressible coil body 231 of the elastic member 23, and then set the head member 221 of the positioning device 22 in the accommodation chamber 211 of the base 21 and rivet the riveting endpiece 2221 of the shank 222 to the riveting hole 2212 of the head member 221. At this time, the peripheral limiter 2211 of the head member 221 is positioned in the position-limiting notch 212 of the base 21 to avoid axial rotation of the positioning device 22 and to maintain the torsion state of the elastic member 23. After installation of the positioning structure 2, insert the handle shaft 13 of the handle 1 into the insertion slot 2161 of the docking portion 216 of the base 21 to keep the mating-connection hole 2162 in axial alignment with the mounting hole 131 of the handle shaft 13, and then rivet the rivet 2163 to the mating-connection hole 2162 and the mounting hole 131 to secure the handle 1 and the positioning structure 2 together. In this way, the handle locking structure of the present invention is assembled.

Referring to FIGS. 6-10, in application, the handle 1 can be installed in an outer side of a respective one of a plurality of sliding boxes 4 in a cabinet 3 of a computer operating system, and a plate member 41 on the outer side of the sliding box 4 can be used for the installation of the handle 1, the plate member 41 is provided with a connecting axle 42. The connecting axle 42 is pivotally rivetted to the pivot hole 111 of the pivot portion 11 of the handle 1. The plate member 41 is further provided with an upright lug 43. The upright lug 43 has a rectangular hook hole 431. When the user holds the handle shaft 13 of the handle 1, and the pivot hole 111 of the pivot portion 11 and the connecting axle 42 of the plate member 41 are used as the axis to make the handle 1 rotate and swing, the positioning structure 2 is moved toward the upright lug 43 of the sliding box 4 to insert the fixing portion 224 of the positioning device 22 into the rectangular hook hole 431 of the upright lug 43. At this time, the stop block 223 of the positioning device 22 is stopped at the surface of the upright lug 43 (see FIG. 7). Then, continuously turn the handle shaft 13 to move the base 21 of the positioning structure 2 along the surface of the stop block 223 to let the stop block 223 be accommodated in the receiving chamber 214 of the base 21 and to compress the elastically compressible coil body 231 of the elastic member 23, thereby disengaging the peripheral limiter 2211 of the head member 221 of the positioning device 22 from the position-limiting notch 212 of the base 21 (see FIG. 8). At the same time, the elastically compressible coil body 231 of the elastic member 23 is reset from the twisted state, so that the positioning means 232 of the elastic member 23 at the stop block 223 is rotated, causing axial rotation of the fixing portion 224 of the positioning device 22. In this way, the stoppers 2241 of the fixing portion 224 are hooked on the other side of the upright lug 43. After the peripheral limiter 2211 of the head member 221 is disengaged from the position-limiting notch 212 of the base 21, it is moved along the sliding groove 213 of the base 21 and then positively stopped at the stop edge 2131 (see FIG. 9). At this time, the buckle groove 121 of the buckle portion 12 of the handle 1 is hooked on a hook block 31 of the cabinet 3. In this way, the sliding box 4 is stabilized, assembled, positioned inside the cabinet 3, and the purpose of locking is completed, and the handle 1 is stable and fixed and will not be easy to loosen or detach.

When removing the sliding box 4 from the cabinet 3, the user can use his finger to pull the peripheral limiter 2211 of the head member 221 back into alignment with the position-limiting notch 212 of the base 21, causing alignment of the two stoppers 2241 of the fixing portion 224 with the rectangular hook hole 431 of upright lug 43. At this time, the elastically compressible coil body 231 of the elastic member 23 is elastically reset. Thus, the two opposite ends of the elastic member 23 are pushed against the bottom surface of the receiving chamber 214 of the base 21 and the surface of the stop block 223 of the positioning device 22, so that the base 21 is displaced outward on the stop block 223 of the positioning device 22. In this way, the peripheral limiter 2211 of the head member 221 enters the position-limiting notch 212 of the base 1 and positioned therein again. The user can then hold the handle shaft 13 of handle 1 and rotate the handle 1 in a fan-shaped reverse direction, so as to disengage the bucket groove 121 of the buckle portion 12 from the hook block 31 of the cabinet 3 and the fixing portion 224 of the positioning device 22 is detached from the rectangular hook hole 431 of the upright lug 43. At this time, the user can pull the sliding box 4 out of the cabinet 3, achieving the use of the handle 1 for the unlocking of the sliding box 4 to complete the use of the present invention.

The pivot portion 11 of the handle 1 is preferably coupled to the connecting axle 42 of the sliding box 4 by riveting. However, in actual application, the pivot portion 11 of the handle 1 can be pivotally connected to the plate member 41 by screwing or snapping. However, there are many ways to pivotally connect the pivot portion 11 of the handle 1 to the sliding box 4, and the above detailed description is for the description of the preferred feasible embodiment of the present invention. The preferred embodiment is not intended to limit the scope of the patent application of the present invention. All other equivalent changes and modifications made without departing from the technical spirit disclosed by the present invention should be included in the scope of the patent covered by the present invention.

Figure 11:
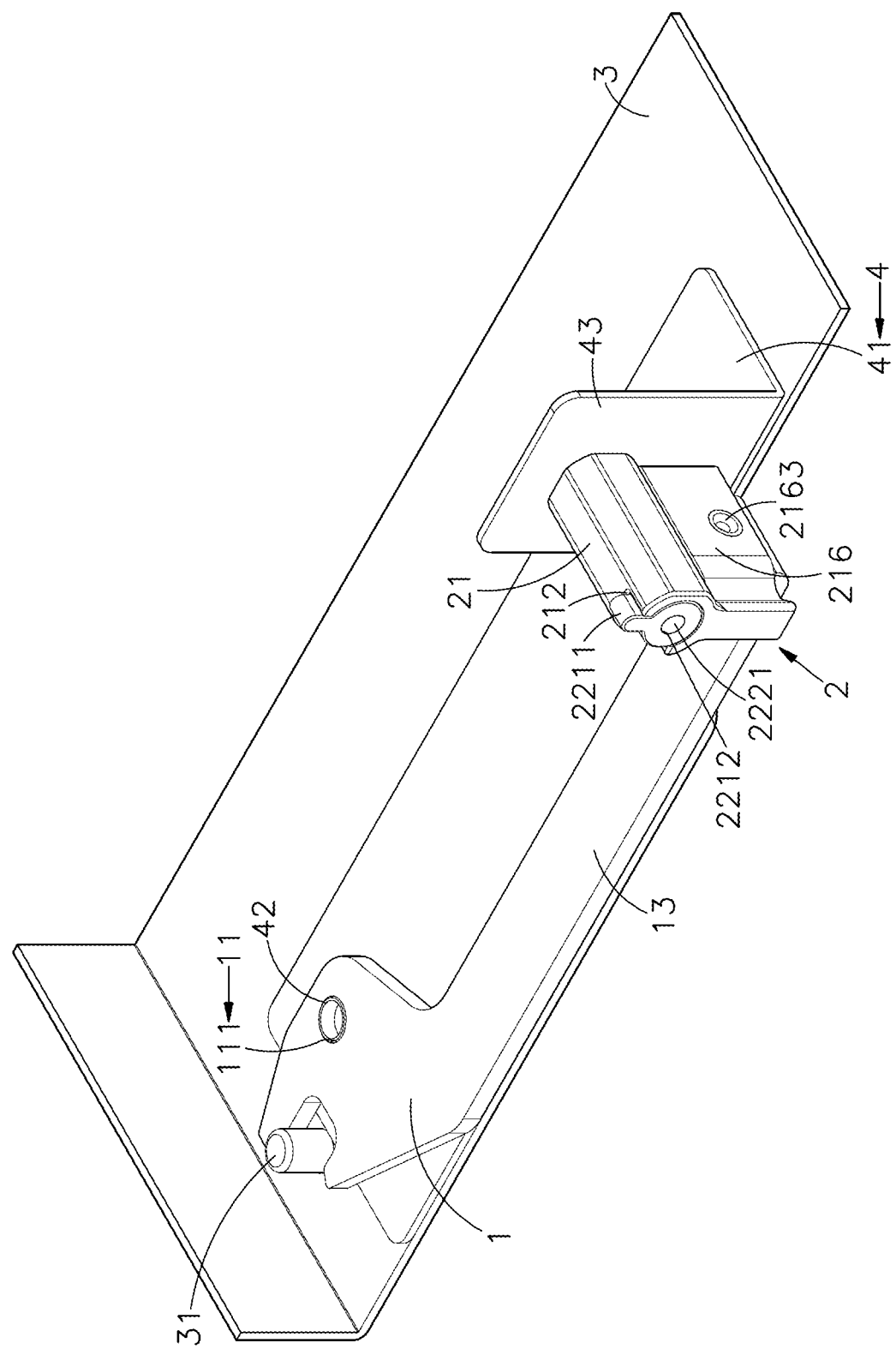
FIG. 11 is an elevational view of an alternate form of the handle locking structure in accordance with the present invention.
Figure 12:
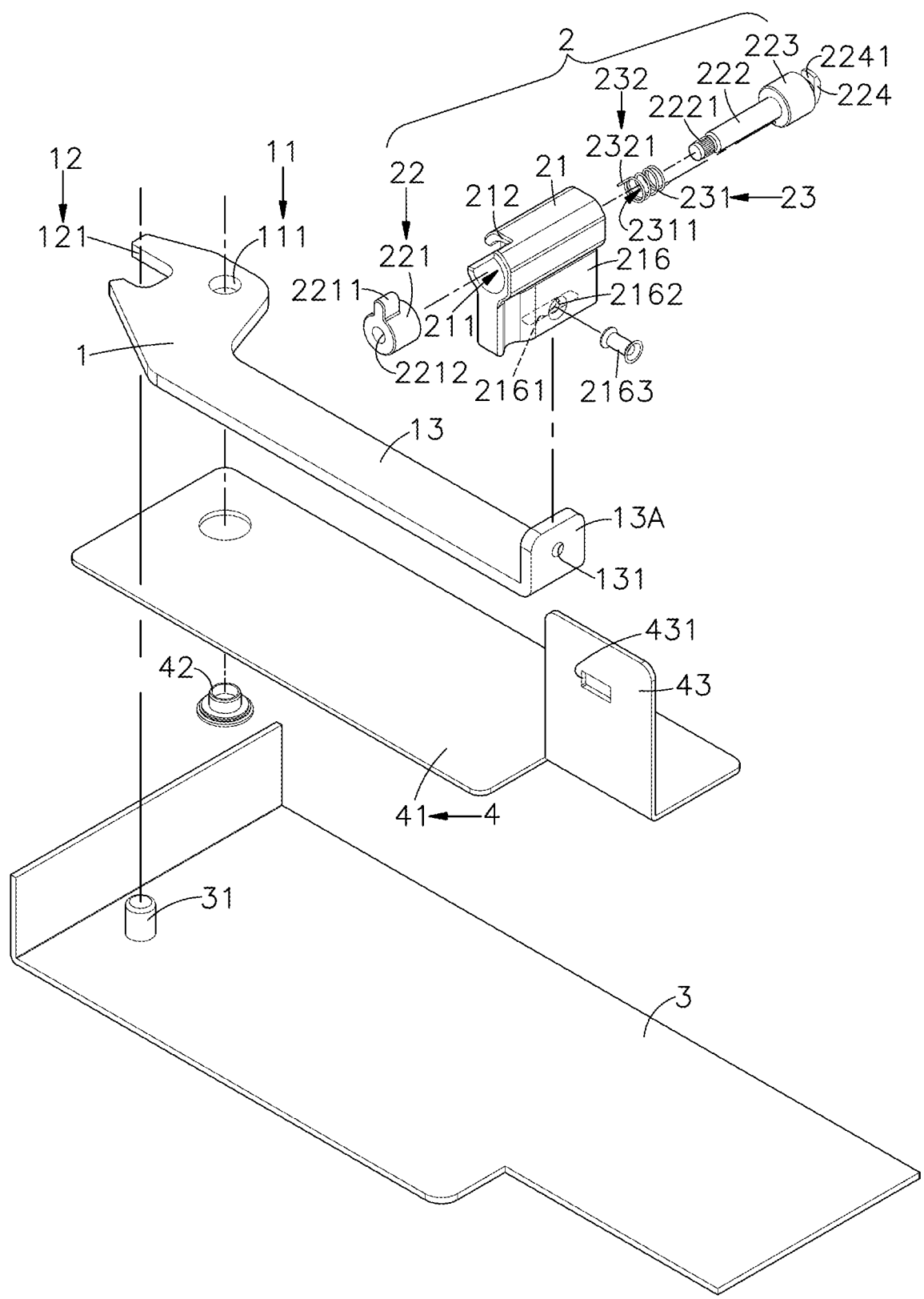
FIG. 12 is an exploded view of the alternate form of the handle locking structure in accordance with the present invention.

Referring to FIGS. 11 and 12, in an alternate form of the handle locking structure of the present invention, the handle shaft 13 of the handle 1 has an angled tailpiece 13A. The angled tailpiece 13A is provided with the mounting hole 131. The positioning structure 2 is installed in the mounting hole 131. Since the setting direction of the positioning structure 2 is ninety degrees compared to the above-described preferred embodiment, the rectangular hook hole 431 on the upright lug 43 of the sliding box 4 is ninety degrees from the setting direction of the above-described preferred embodiment to make the positioning device 22 of the positioning structure 2 be securely positioned in the rectangular hook hole 431. In addition, the angled tailpiece 13A is bent at the end of the handle shaft 13, so the overall width can be reduced by the angled tailpiece 13A, and can be used to flash the electronic components inside the sliding box 4 (not shown), thereby improving the versatility of use.

Figure 13:
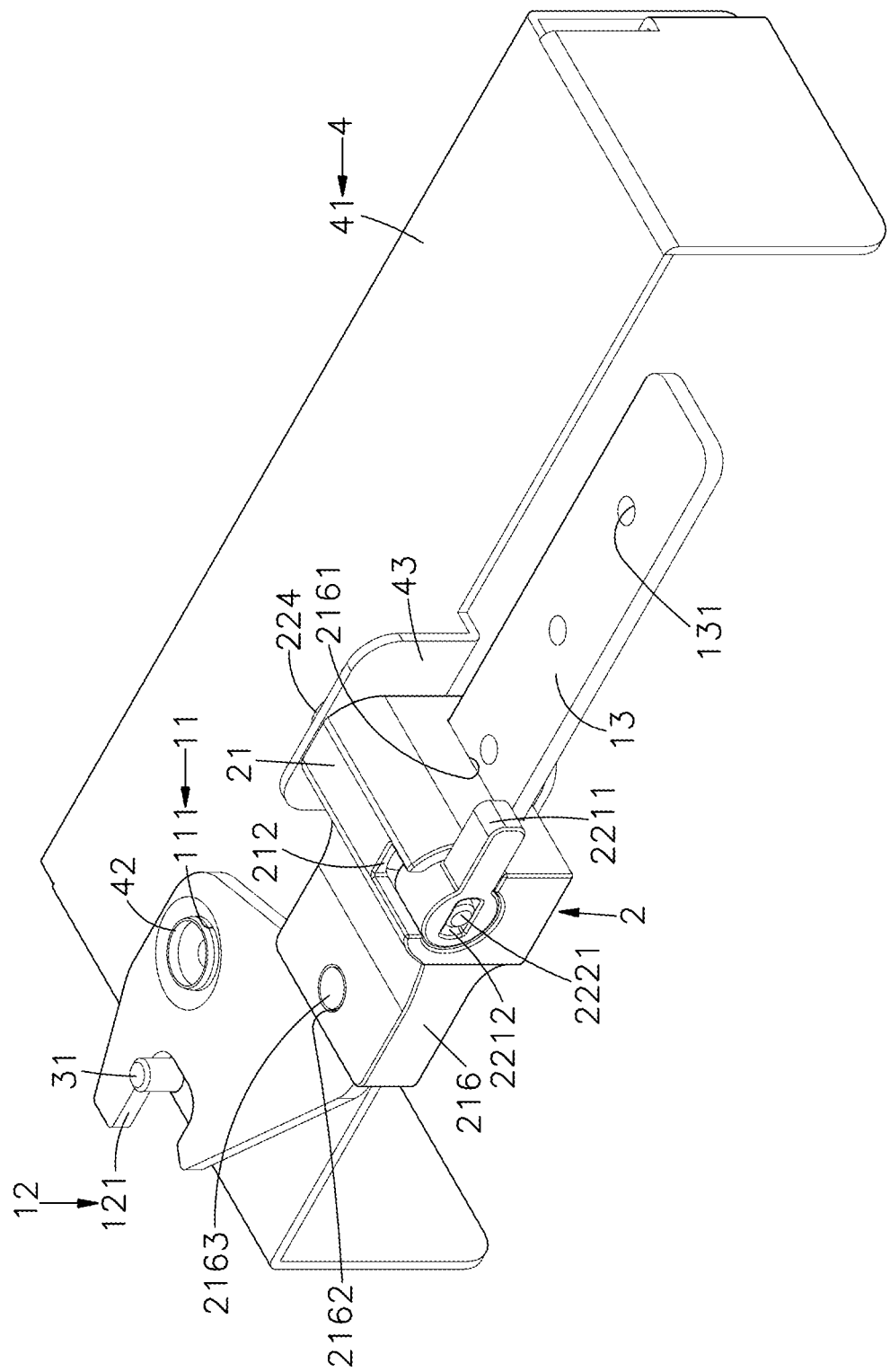
FIG. 13 is an elevational view of another alternate form of the handle locking structure in accordance with the present invention.
Figure 14:
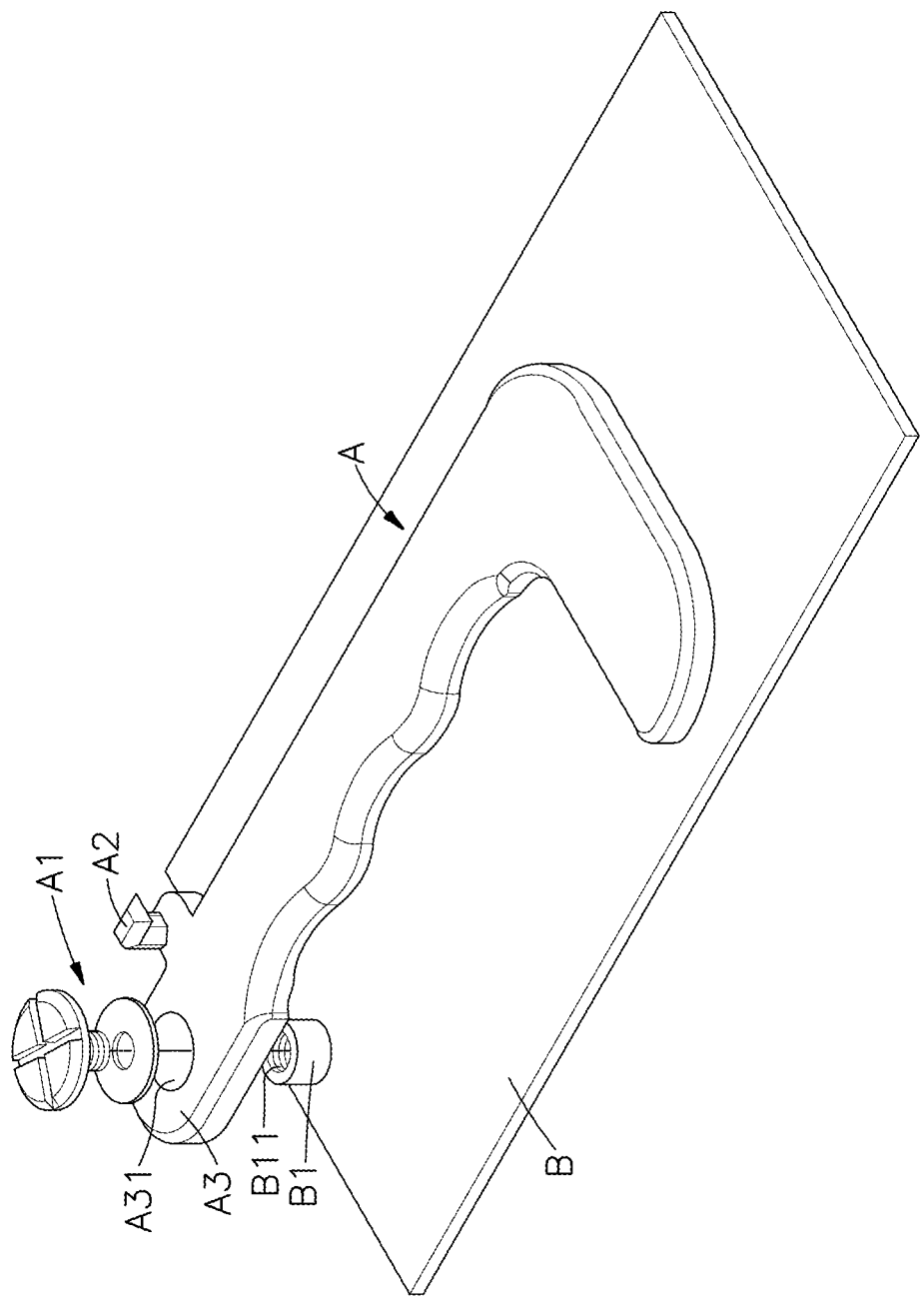
FIG. 14 is an exploded view of a cabinet buckle structure according to the prior art.
Figure 15:
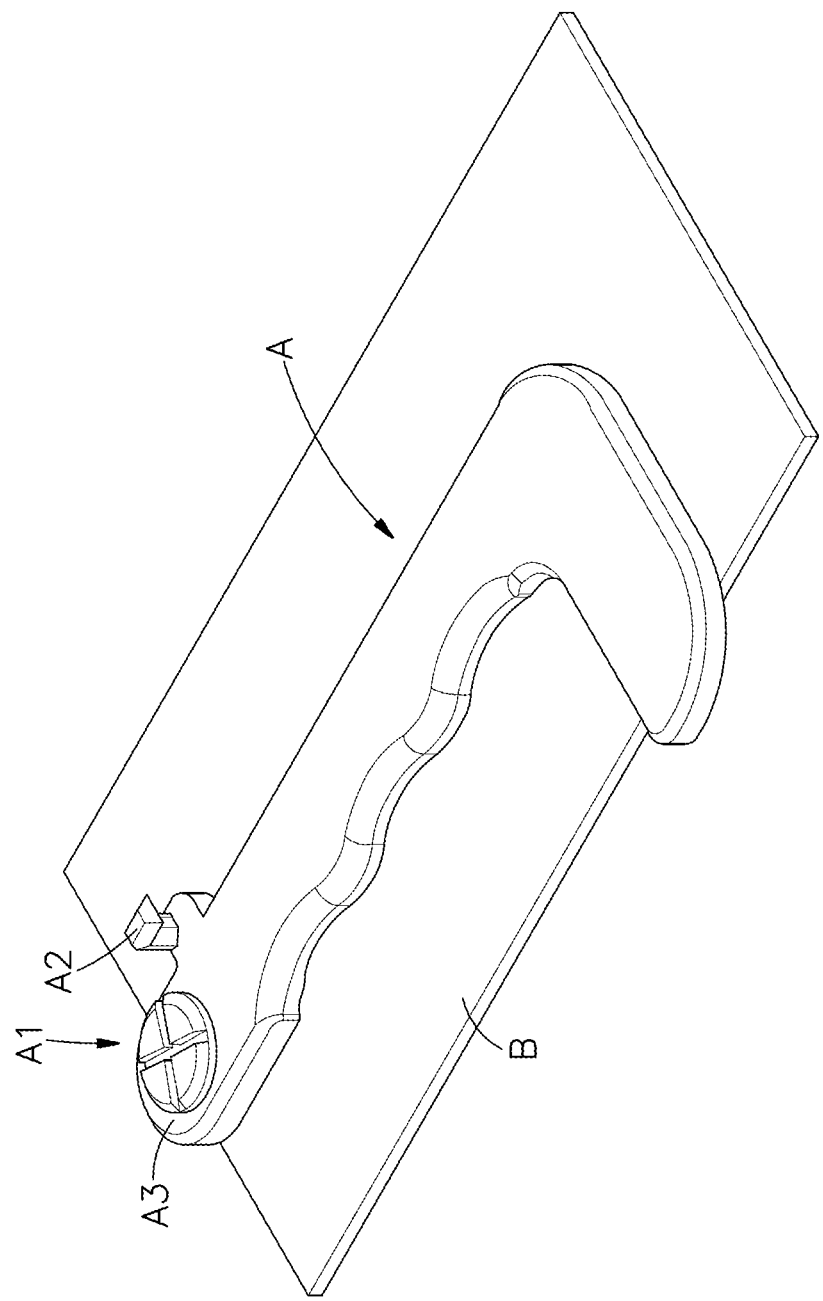
FIG. 15 is an elevational assembly view of the cabinet buckle structure according to the prior art.

Referring to FIG. 13, in another alternate form of the handle locking structure of the present invention, the handle shaft 13 of handle 1 is provided with a plurality of mounting holes 131 at intervals, and the insertion slot 2161 on the docking portion 216 of the base 21 of the positioning structure 2 is horizontally penetrating. When the handle shaft 13 of handle 1 is inserted into the insertion slot 2161 on the docking portion 216 of the base 21 of the positioning structure 2, it extends out of the base 21 of the positioning structure 2 so that the base 21 of the positioning structure 2 can be slidably moved along the handle shaft 13 of handle 1, allowing the rivet 2163 at the docking portion 216 to be selectively rivetted to one of the mounting holes 131 to improve the convenience and versatility of use. When the handle 1 is turned to perform the locking or unlocking operation, the overall length of the handle 1 does not change, so the original torque of the handle 1 can be maintained, and the smoothness of operation can be maintained.

The present invention has the following advantages:

1. When the buckle portion 12 of the handle 1 is hooked on the cabinet 3, the peripheral limiter 2211 of the head member 221 is disengaged from the position-limiting notch 212 of the base 21 to elastically reset the elastic member 23 from the twisted state, so that the fixing portion 224 of the positioning device 22 is automatically locked to the sliding box 4. In this way, the handle locking structure is firmly combined with the sliding box 4 without vibration, avoid loosening due to collisions and achieving the purpose of improving the locking stability of the buckle portion 12 of the handle 1.

2. When positioning the positioning structure 2 on the sliding box 4, simply by turning the handle 1 to automatically achieve the locking effect, so that the operation process is intuitive and no additional locking is required, improving the smoothness of locking.

3. When the positioning structure 2 is positioned on the sliding box 4, the elastic member 23 is elastically compressed. When unlocking the positioning structure 2, the peripheral limiter 2211 of the head member 221 is aimed at the position-limiting notch 212 of the base 21, at this time, the elastically compressible coil body 231 of the elastic member 23 is elastically reset to push the base 21 and the positioning device 22 outward, causing the peripheral limiter 2211 of the head member 221 to be automatically engaged into the position-limiting notch 212 of the base 21, thereby improving the convenience during operation.

The above is only the preferred embodiments of the present invention, and these preferred embodiments are not used to limit the patent scope of the present invention. Therefore, any simple modifications and equivalent structural changes that are made by using the description and drawings of the present invention should be included in the scope of the patent of this invention.

In summary, when the handle locking structure of the present invention is used, it indeed achieves its efficacy and purpose, therefore, the present invention is an invention with excellent practicality. In order to meet the requirements of the invention patent application, the present application is filed in accordance with the law, and we hope the review committee will grant this case as soon as possible to protect the inventor's hard invention.

What the invention claimed is:

1. A handle locking structure, comprising:
a handle comprising a pivot portion pivotally connected to a sliding box, a buckle portion located at one side relative to said pivot portion for hooking on a cabinet and a handle shaft located at an opposite side relative to said pivot portion; and
a positioning structure comprising a base connected to said handle shaft, a positioning device mounted in said base and an elastic member placed on said positioning device, said base comprising a perforation, an accommodation chamber with a larger outer diameter recessed on one end of said perforation and a position-limiting notch located on the peripheral wall of said accommodation chamber, said positioning device comprising a head member accommodated in said accommodation chamber and provided with a peripheral limiter for positioning in said position-limiting notch, a shank inserted through said perforation and connected with one end thereof to said head member, a stop block located at an opposite end of said shank for stopping against an upright lug of said cabinet and a fixing portion extended from said stop block opposite to said shank for positioning on said upright lug of said cabinet, said elastic member comprising an elastically compressible coil body mounted around said shank and two positioning means respectively located at two opposite ends of said elastically compressible coil body and respectively fastened to said base and said stop block;
wherein when said buckle portion of said handle is unhooked from said cabinet, said fixing portion of said positioning device is disengaged from said upright lug of said cabinet, said elastically compressible coil body of said elastic member is twisted and elastically uncompressed; when said buckle portion of said handle is hooked on said cabinet, said fixing portion of said positioning device is positioned on said upright lug of said cabinet, said peripheral limiter of said head member is disengaged from said position-limiting notch of said base, and said elastically compressible coil body of said elastic member is untwisted and elastically compressed.

2. The handle locking structure as claimed in claim 1, wherein said pivot portion of said handle has a vertically extended pivot hole.

3. The handle locking structure as claimed in claim 1, wherein said buckle portion of said handle has a buckle groove on one side thereof.

4. The handle locking structure as claimed in claim 1, wherein said handle shaft of said handle has a vertically extended mounting hole; said base of said positioning structure further comprises a docking portion located at one side thereof, an insertion slot formed in one side of said docking portion for the insertion of said handle shaft, a mating-connection hole cut through opposing top and bottom sides of said docking portion across said insertion slot, and a rivet fastened to two said mating-connection hole and said mounting hole to connect said handle shaft to said docking portion.

5. The handle locking structure as claimed in claim 4, wherein said base of said positioning structure further comprises a finger rod extended from an opposite side thereof remote from said docking portion.

6. The handle locking structure as claimed in claim 1, wherein said base further comprises a sliding groove located on the peripheral wall of said accommodation chamber and radially extended from a part of one lateral side of said position-limiting notch, and a stop edge located on the peripheral wall of said accommodation chamber at one end of said sliding groove remote from said position-limiting notch.

7. The handle locking structure as claimed in claim 1, wherein said base further comprises a receiving chamber with a larger outer diameter recessed on an opposite end of said perforation for accommodating said stop block, and a positioning hole located on an inner bottom wall of said receiving chamber; said stop block has a recessed hole located on a front side thereof adjacent to said shank; said two positioning means of said elastic member are positioning tips respectively extended from the two opposite ends of said elastically compressible coil body and respectively fastened to said positioning hole and said recessed hole.

8. The handle locking structure as claimed in claim 1, wherein said head member of said positioning device has an axially extended riveting hole; said shank of said positioning device has a riveting endpiece extended from one end thereof and rivetted to said riveting hole of said head member.

9. The handle locking structure as claimed in claim 1, wherein said fixing portion of said positioning device has two stoppers respectively extended from two opposite lateral sides thereof.

10. The handle locking structure as claimed in claim 1, wherein said elastically compressible coil body of said elastic member defines therein a passage hole for the passing of said shank.

11. The handle locking structure as claimed in claim 1, wherein said handle shaft of said handle has a distal end thereof terminating in an angled tailpiece, said angled tailpiece being provided with a mounting hole; said base of said positioning structure further comprises a docking portion located at one side thereof, an insertion slot formed in one side of said docking portion for the insertion of said handle shaft, a mating-connection hole cut through opposing top and bottom sides of said docking portion across said insertion slot, and a rivet fastened to two said mating-connection hole and said mounting hole to connect said handle shaft to said docking portion.

12. The handle locking structure as claimed in claim 1, wherein said handle shaft of said handle shaft is provided with a plurality of mounting holes at intervals; said base of said positioning structure further comprises a docking portion located at one side thereof, an insertion slot horizontally cut through said docking portion for the insertion of said handle shaft, a mating-connection hole cut through opposing top and bottom sides of said docking portion across said insertion slot, and a rivet fastened to two said mating-connection hole and a selected one of said mounting holes to connect said handle shaft to said docking portion.

* * * * *